(12) United States Patent
Kim

(10) Patent No.: US 11,968,860 B2
(45) Date of Patent: Apr. 23, 2024

(54) ORGANIC LIGHT EMITTING DISPLAY DEVICE INCLUDING DAM STRUCTURE AND ALIGNMENT MARK

(71) Applicant: LG DISPLAY CO., LTD., Seoul (KR)

(72) Inventor: Dongjin Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/080,367

(22) Filed: Dec. 13, 2022

(65) Prior Publication Data

US 2023/0116429 A1    Apr. 13, 2023

Related U.S. Application Data

(63) Continuation of application No. 17/107,388, filed on Nov. 30, 2020, now Pat. No. 11,552,141, which is a (Continued)

(30) Foreign Application Priority Data

Dec. 31, 2015 (KR) .......................... 10-2015-0190595

(51) Int. Cl.
*H10K 50/84* (2023.01)
*H10K 50/842* (2023.01)
(Continued)

(52) U.S. Cl.
CPC ....... *H10K 59/122* (2023.02); *H10K 50/8426* (2023.02); *H10K 59/127* (2023.02); *G09G 2300/0408* (2013.01); *G09G 2300/0804* (2013.01); *H01L 23/544* (2013.01); *H01L 23/573* (2013.01); *H01L 33/22* (2013.01);
(Continued)

(58) Field of Classification Search
CPC .. H10K 50/8426; H10K 50/84; H10K 50/844; H10K 59/122; H10K 59/127; H10K 59/1216; H10K 59/1275; H10K 59/131; H10K 10/88; H10K 30/88; H10K 2102/00; H01L 23/544; H01L 23/573; H01L 33/22; H01L 33/24; H01L 33/44; H01L 2223/54426; H01L 2224/83051; H05K 2201/09909; G09G 2300/0408; G09G 2300/0804
See application file for complete search history.

(56) References Cited

U.S. PATENT DOCUMENTS 5,220,200 A    6/1993 Blanton
6,636,192 B1 * 10/2003 Saitoh ................... G02F 1/1339
                                                               345/87
(Continued)

FOREIGN PATENT DOCUMENTS

JP    2004258487 A    9/2004
JP    2008010450 A    1/2008
(Continued)

*Primary Examiner* — Ida M Soward
(74) *Attorney, Agent, or Firm* — Fenwick & West LLP

(57) ABSTRACT

An organic light emitting display device including a dam structure disposed in a non-display area of a substrate and an alignment mark disposed outside the dam structure. The alignment mark is not covered by, and does not overlap with, the dam structure, because the alignment mark is disposed outside the dame structure. Thus, a scribing process may be performed smoothly.

13 Claims, 8 Drawing Sheets

Related U.S. Application Data continuation of application No. 16/380,728, filed on Apr. 10, 2019, now Pat. No. 10,916,604, which is a continuation of application No. 15/959,780, filed on Apr. 23, 2018, now Pat. No. 10,304,916, which is a continuation of application No. 15/362,412, filed on Nov. 28, 2016, now Pat. No. 9,978,820.

(51) Int. Cl.
| | |
|---|---|
| *H10K 59/12* | (2023.01) |
| *H10K 59/122* | (2023.01) |
| *H10K 59/127* | (2023.01) |
| *H01L 23/00* | (2006.01) |
| *H01L 23/544* | (2006.01) |
| *H01L 33/22* | (2010.01) |
| *H01L 33/24* | (2010.01) |
| *H01L 33/44* | (2010.01) |
| *H10K 10/88* | (2023.01) |
| *H10K 30/88* | (2023.01) |
| *H10K 50/844* | (2023.01) |
| *H10K 59/121* | (2023.01) |
| *H10K 71/00* | (2023.01) |
| *H10K 102/00* | (2023.01) |

(52) U.S. Cl.
CPC ............ *H01L 33/24* (2013.01); *H01L 33/44* (2013.01); *H01L 2223/54426* (2013.01); *H01L 2224/83051* (2013.01); *H05K 2201/09909* (2013.01); *H10K 10/88* (2023.02); *H10K 30/88* (2023.02); *H10K 50/84* (2023.02); *H10K 50/844* (2023.02); *H10K 59/1216* (2023.02); *H10K 59/1275* (2023.02); *H10K 71/851* (2023.02); *H10K 2102/00* (2023.02)

(56) References Cited

U.S. PATENT DOCUMENTS

| | | | |
|---|---|---|---|
| 7,255,823 B1 | 8/2007 | Guenther et al. | |
| 7,279,063 B2 | 10/2007 | Yokajty et al. | |
| 7,317,281 B2 | 1/2008 | Hayashi et al. | |
| 7,323,814 B2 * | 1/2008 | Miyazaki .................. H04N 9/30 | |
| | | | 313/496 |
| 7,365,824 B2 | 4/2008 | Byun et al. | |
| 7,729,039 B2 | 6/2010 | Lecain et al. | |
| 7,750,457 B2 | 7/2010 | Seko | |
| 7,936,062 B2 | 5/2011 | Humpston et al. | |
| 7,947,516 B2 | 5/2011 | Bisberg | |
| 8,188,509 B2 * | 5/2012 | Lee ................... H10K 50/8426 | |
| | | | 257/E33.059 |
| 8,237,905 B2 * | 8/2012 | Kondo .................. G02F 1/1339 | |
| | | | 349/155 |
| 8,344,360 B2 | 1/2013 | Auch et al. | |
| 8,416,370 B2 | 4/2013 | Yokogawa | |
| 8,518,727 B2 | 8/2013 | Ryu et al. | |
| 8,558,255 B2 | 10/2013 | Bisberg | |
| 8,884,849 B2 | 11/2014 | Masuda | |
| 8,977,990 B2 * | 3/2015 | An ............................. G03F 1/42 | |
| | | | 716/54 |
| 9,041,199 B2 | 5/2015 | Murai et al. | |
| 9,057,501 B2 | 6/2015 | Cho | |
| 9,065,021 B2 * | 6/2015 | Nagata .................... H01L 33/48 | |
| 9,155,135 B2 | 10/2015 | Okumura | |
| 9,330,947 B2 | 5/2016 | Hu et al. | |
| 9,368,745 B2 * | 6/2016 | Lee ......................... H10K 50/80 | |
| 9,492,820 B2 | 11/2016 | Reed et al. | |
| 9,570,708 B2 | 2/2017 | Kim et al. | |
| 9,658,650 B2 | 5/2017 | Cho | |
| 9,826,641 B2 | 11/2017 | Funahashi et al. | |
| 9,832,860 B2 | 11/2017 | Starkston et al. | |
| 9,946,114 B2 * | 4/2018 | Choi ....................... G02F 1/1337 | |
| 10,714,525 B2 | 7/2020 | Yee et al. | |
| 2002/0187575 A1 * | 12/2002 | Maruyama ........... H10K 50/846 | |
| | | | 438/33 |
| 2003/0017777 A1 | 1/2003 | Matsuoka et al. | |
| 2005/0155704 A1 * | 7/2005 | Yokajty ................. H10K 50/846 | |
| | | | 445/25 |
| 2007/0027571 A1 | 2/2007 | Kamiya et al. | |
| 2007/0285007 A1 * | 12/2007 | Lee ....................... H10K 50/841 | |
| | | | 313/504 |
| 2008/0079349 A1 | 4/2008 | Miyazaki et al. | |
| 2009/0059141 A1 * | 3/2009 | Nagasawa ............. G02F 1/1333 | |
| | | | 349/111 |
| 2009/0091701 A1 | 4/2009 | Kondo .................. G02F 1/1339 | |
| | | | 349/153 |
| 2011/0114991 A1 | 5/2011 | Lee ...................... H01L 51/5246 | |
| | | | 257/E33.059 |
| 2011/0121352 A1 | 5/2011 | Hesse et al. | |
| 2012/0056523 A1 * | 3/2012 | Han ..................... H10K 59/8722 | |
| | | | 313/243 |
| 2012/0153462 A1 | 6/2012 | Wakiyama | |
| 2013/0049184 A1 | 2/2013 | Kasahara et al. | |
| 2014/0184059 A1 | 7/2014 | Masuda | |
| 2015/0028307 A1 * | 1/2015 | Kim ....................... H10K 50/844 | |
| | | | 257/40 |
| 2015/0084055 A1 * | 3/2015 | Nagata .................... H10K 71/00 | |
| | | | 438/27 |
| 2015/0261258 A1 * | 9/2015 | Kim ....................... G06F 3/0446 | |
| | | | 345/173 |
| 2015/0263309 A1 * | 9/2015 | Hong ...................... H10K 59/40 | |
| | | | 257/40 |
| 2015/0362165 A1 * | 12/2015 | Chu ......................... H01L 33/32 | |
| | | | 362/235 |
| 2016/0035996 A1 | 2/2016 | Sun et al. | |
| 2016/0066774 A1 * | 3/2016 | Fujimori ................. H04N 23/55 | |
| | | | 600/112 |
| 2016/0104863 A1 * | 4/2016 | Park .................... H10K 50/8426 | |
| | | | 438/28 |
| 2016/0141552 A1 | 5/2016 | Chen | |
| 2016/0270209 A1 | 9/2016 | Cho | |
| 2017/0077169 A1 | 3/2017 | Masuda | |
| 2017/0157949 A1 | 6/2017 | Madigan et al. | |
| 2018/0159070 A1 | 6/2018 | He ......................... H01L 27/3244 |

FOREIGN PATENT DOCUMENTS

| | | | | |
|---|---|---|---|---|
| JP | 2014-102371 A | 6/2014 | | |
| KR | 20140065284 A | 5/2014 | | |
| WO | 2008/102866 A1 | 8/2008 | | |
| WO | WO-2012011268 A1 | 1/2012 | ......... | H01L 27/3272 |
| WO | 2015/000095 A1 | 1/2015 | | |

* cited by examiner

ORGANIC LIGHT EMITTING DISPLAY DEVICE INCLUDING DAM STRUCTURE AND ALIGNMENT MARK

CROSS-REFERENCE TO RELATED APPLICATIONS

This application is a continuation application of U.S. application Ser. No. 17/107,388, filed on Nov. 30, 2020; which is a continuation of U.S. application Ser. No. 16/380, 728, filed on Apr. 10, 2019, now U.S. Pat. No. 10,916,604; which is a continuation of U.S. application Ser. No. 15/959, 780, filed on Apr. 23, 2018, now U.S. Pat. No. 10,304,916; which is a continuation of U.S. application Ser. No. 15/362, 412, filed on Nov. 28, 2016, now U.S. Pat. No. 9,978,820; which claims the benefit of Korean Patent Application No. 10-2015-0190595 filed on Dec. 31, 2015, which are hereby incorporated by reference as if fully set forth herein.

BACKGROUND

Field of the Invention

The present invention relates to an organic light emitting display device, and to an align mark necessary for a scribing process which is performed for obtaining a plurality of unit panels from a mother substrate.

Discussion of the Related Art

Organic light emitting display devices are display devices that self-emit light, and have a structure where an organic emission layer is formed between a cathode and an anode. Due to this structure, an electron supplied from the cathode and a hole supplied from the anode are injected into the organic emission layer to generate an exciton, and the generated exciton shifts from an excited state to a ground state to emit light.

The organic light emitting display devices are obtained through a process where a plurality of unit panels (U/P) are provided on a mother substrate and then are cut through a scribing process. Hereinafter, a related art organic light emitting display device will be described with reference to FIGS. 1A to 1C.

FIGS. 1A to 1C are schematic illustrations of a process of manufacturing a related art organic light emitting display device.

First, as shown in FIG. 1A, a plurality of unit panels U/P are provided on a mother substrate 1a. In the drawings, only two unit panels U/P are illustrated for convenience.

First alignment marks 2 for a first scribing process are formed at the corners of the mother substrate 1a, and second alignment marks 3 for a second scribing process are formed at the corners of each of the plurality of unit panels U/P.

Subsequently, as shown in FIG. 1B, a first scribing process is performed by using the first alignment marks 2 to obtain a plurality of unit panels U/P.

In this case, a test area T/A is provided in each of the plurality of unit panels U/P, and a test process is performed for each of the unit panels U/P.

Subsequently, as shown in FIG. 1C, a second scribing process is performed by using the second alignment marks 3 formed in each of the unit panels U/P, and the test area T/A is removed from the each of the unit panels U/P.

As described above, the related art organic light emitting display device is manufactured using the first scribing process based on the first alignment marks 2 and the second scribing process based on the second alignment marks 3. However, the second alignment marks 3 are not easily and clearly observable during the second scribing process. Thus, the second scribing process is not performed smoothly.

In FIG. 1C, the enlarged portion corresponds to a cross-sectional surface of an area where a second alignment mark 3 is formed. In this case, each of the second alignment marks 3 are formed on a substrate 1, an encapsulation layer 5 for preventing penetration of water is formed on each of the second alignment marks 3, and an encapsulation substrate 7 is provided on the encapsulation layer 5.

As described above, in the related art, since the encapsulation layer 5 is formed on the second alignment marks 3, the second alignment marks 3 are not easily observable, and the second scribing process for removing the test area T/A from each of the unit panels U/P is not performed easily or smoothly.

SUMMARY

Accordingly, the present application provides an organic light emitting display device that substantially obviates one or more problems due to limitations and disadvantages of the related art.

An aspect of the present disclosure provides an organic light emitting display device in which an alignment mark is easily and clearly observable, and thus, a scribing process can be performed smoothly.

To achieve these and other advantages and in accordance with the purpose of the invention, as embodied and broadly described herein, there is provided a dam structure disposed in a non-display area of a substrate and a first alignment mark disposed outside the dam structure. In this case, the dam structure includes a first dam structure arranged in a first direction, a second dam structure arranged in a second direction, and a third dam structure connected at an incline to each of the first dam structure and the second dam structure, and the first alignment mark is disposed outside the third dam structure.

In another exemplary embodiment, the the first dam structure and the second dam structure are arranged in parallel with an outermost line of the active area in the first direction and an outermost line of the active area in the second direction, respectively, and the third structure is arranged apart from, and at an angle to, a vertex at which the outermost line of the active area in the first direction meets the outermost line of the active area in the second direction.

In another exemplary embodiment, the first dam structure comprises a first sealant, a first outer dam bank disposed on an outer side of the first sealant, and a first inner dam bank disposed on an inner side of the first sealant, the second dam structure comprises a second sealant, a second outer dam bank disposed on an outer side of the second sealant, and a second inner dam bank disposed on an inner side of the second sealant, the third dam structure comprises a third sealant, a third outer dam bank disposed on an outer side of the third sealant, and a third inner dam bank disposed on an inner side of the third sealant, one end of the third sealant is connected to the first sealant, and the other end of the third sealant is connected to the second sealant, one end of the third outer dam bank is connected to the first outer dam bank, and the other end of the third outer dam bank is connected to the second outer dam bank, and one end of the third inner dam bank is connected to the first inner dam bank, and the other end of the third inner dam bank is connected to the second inner dam bank.

In another exemplary embodiment, a distance between the third inner dam bank and a vertex at which an outermost line of the active area in the first direction meets an outermost line of the active area in the second direction is equal to or greater than a distance between the first inner dam bank and the outermost line of the active area in the first direction or the distance between the second inner dam bank and the outermost line of the active area in the second direction.

In another exemplary embodiment, at least one of the third outer dam bank and the third inner dam bank has a concave-convex structure.

In another exemplary embodiment, the first alignment mark is disposed on an extension line of the first dam structure or the second dam structure.

In another exemplary embodiment, the first alignment mark is disposed inward from an extension line of the first dam structure or the second dam structure.

In another exemplary embodiment, the substrate comprises a pad area in the non-display area, and a second alignment mark is further provided in the pad area.

In another exemplary embodiment, the dam structure is not disposed in the pad area.

In another exemplary embodiment, the third dam structure has a rectilinear structure.

In another exemplary embodiment, the third dam structure has a curve structure.

In another exemplary embodiment, the curve structure is convex in an outer direction.

In another exemplary embodiment, the curve structure is convex in an inner direction.

In another exemplary embodiment, the substrate comprises a pad area in the non-display area, and a second alignment mark is disposed outside the third dam structure such that the second alignment mark does not overlap with the pad area.

In another exemplary embodiment, the dam structure is not disposed in the pad area.

In another exemplary embodiment, the display device further comprises a second substrate; and a filler disposed between the first substrate and the second substrate, and extending from the active area to an inner side of the dam structure.

Additional advantages and features of the present disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed. However, the present invention is not limited thereto, and may include additional features and alternate embodiments within the purview of the art.

BRIEF DESCRIPTION OF THE DRAWINGS

The accompanying drawings provide a further understanding of the invention, and are incorporated in and constitute a part of this application The accompanying drawings illustrate embodiments of the invention and together with the description serve to explain the principle of the invention. In the drawings.

DETAILED DESCRIPTION OF THE INVENTION

Figure 1A:
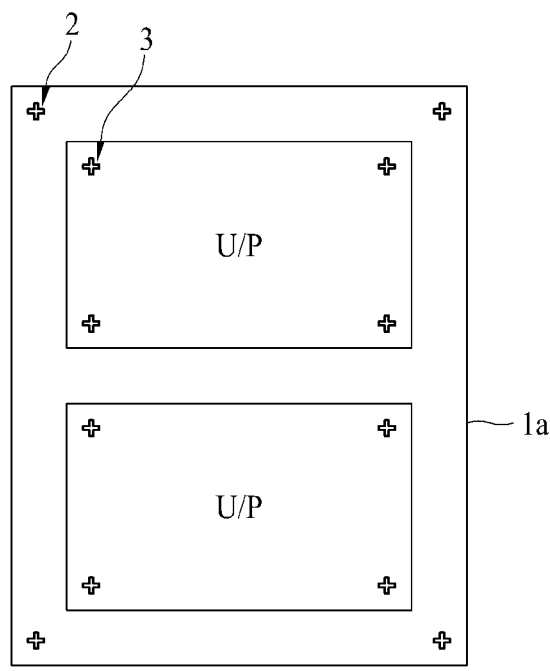
FIGS. 1A to 1C are plan views illustrating a process of manufacturing a related art organic light emitting display device.
Figure 1B:
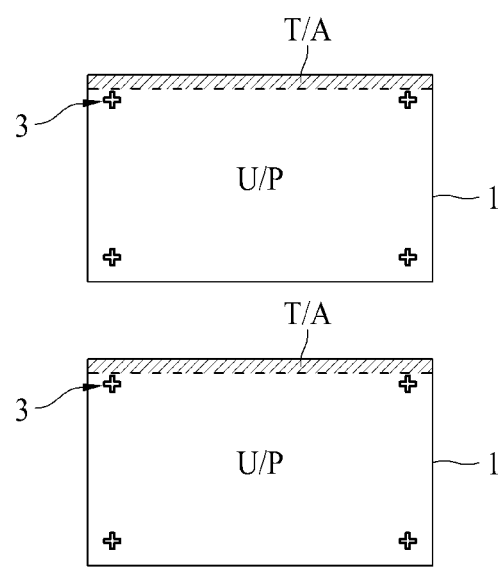
Figure 1C:
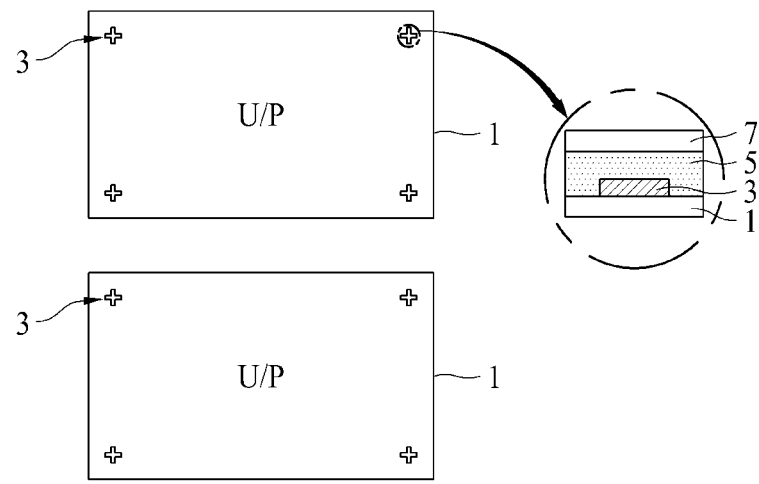

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present invention, and implementation methods thereof will be clarified by the following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present application to those skilled in the art. The present invention is only defined by the scope of any appended claims.

A shape, a size, a ratio, an angle, and a number disclosed in the drawings for describing embodiments of the present disclosure are merely exemplary, and thus, the present invention is not limited to the illustrated details. Like reference numerals refer to like elements throughout. In the following description, when the detailed description of relevant known functions or configurations are determined to unnecessarily obscure the important points of the present disclosure, the detailed description will be omitted. The terms 'comprise', 'have', and 'include' in the present specification may include additional parts unless the term 'only~' is also used with such terms. The terms of a singular form may include plural forms unless referred to the contrary.

In construing an element, an error range may be included even if no explicit description regarding the same in included in the specification.

In describing a position relationship, for example, when a position relation between two parts is described as 'on~', 'over~', 'under~', or 'next~', one or more parts may be disposed between the two parts unless the term 'just' or 'direct' is also used with such terms.

In describing a time relationship, for example, when the temporal order is described as 'after~', 'subsequent~', 'next~', or 'before~', a case which is not continuous may be included unless the term 'just' or 'direct' is also used with such terms.

Although the terms "first", "second", etc. may be used herein to describe various elements, these elements are not be limited by these terms. These terms are only used to distinguish one element from another. For example, a first element could, alternatively, be termed a second element, and, similarly, a second element could, alternatively, be termed a first element, without departing from the scope of the present disclosure.

Features of various embodiments of the present disclosure may be partially or completely coupled to, or combined with, each other, and may be variously inter-operated with each other and driven technically as those skilled in the art can sufficiently understand. Further, the embodiments of the present disclosure may be carried out independently from each other, or may be carried out together in co-dependent relationship.

Hereinafter, various embodiments of the present disclosure will be described in detail with reference to the accompanying drawings.

Figure 2:
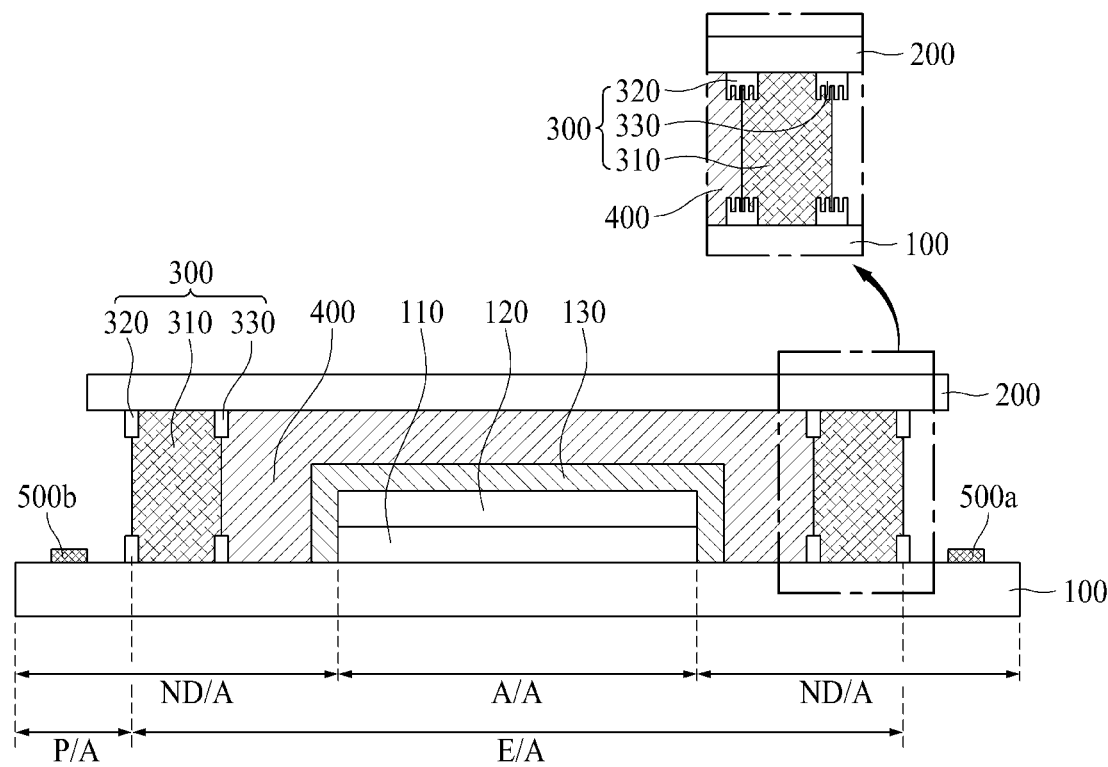
FIG. 2 is a cross-sectional view of an organic light emitting display device according to a first embodiment of the present disclosure.

FIG. 2 is a cross-sectional view of an organic light emitting display device according to a first embodiment of the present disclosure.

As shown in FIG. 2, the organic light emitting display device according to the first embodiment may include a first substrate 100, a second substrate 200, a dam structure 300, a filler 400, and a plurality of alignment marks 500a and 500b.

The first substrate 100 may be formed of glass or transparent plastic. An active area A/A, a non-display area ND/A, a pad area P/A, and an encapsulation area E/A may be provided on the first substrate 100.

A plurality of pixels P may be provided in the active area A/A, thereby displaying an image. In order to display an image, a circuit device layer 110 and an emission device layer 120 may be disposed in the active area A/A on the first substrate 100.

The circuit device layer 110 may be formed on the first substrate 100, and although not shown in detail, the circuit device layer 110 may include a gate line, a data line, a power line, a switching thin film transistor (TFT), a driving TFT, and a capacitor. A detailed configuration of the circuit device layer 110 may be modified into various types well known to those skilled in the art.

The emission device layer 120 may be formed on the circuit device layer 110, and although not shown in detail, the emission device layer 120 may include a bank layer, an anode, a cathode, and an organic emission layer disposed between the anode and the cathode. A detailed configuration of the emission device layer 120 may be modified into various types well known to those skilled in the art.

The non-display area ND/A may be an area that cannot display an image, and may be provided outside the active area A/A.

The pad area P/A may be disposed in the non-display area ND/A. A plurality of signal pads connected to an external driver may be disposed in the pad area P/A. Therefore, the external driver may be connected to the plurality of signal pads disposed in the pad area P/A and may apply signals to the active area A/A. In this manner, the pad area P/A may be exposed to the outside so as to be connected to the external driver. In order for the pad area P/A provided on the first substrate 100 to be exposed to the outside, the second substrate 200 may be shorter in length than the first substrate 100, and moreover, the encapsulation area E/A may not extend to the pad area P/A.

The encapsulation area E/A prevents water from penetrating into the active area A/A. In order to prevent penetration of water, a passivation layer 130 may be disposed on the emission device layer 120, the filler 400 may be disposed on the passivation layer 130, and the dam structure 300 may be disposed outside the filler 400. Therefore, an area where the passivation layer 130, the filler 400, and the dam structure 300 are disposed may correspond to the encapsulation area E/A. As a result, the encapsulation area E/A may include the active area A/A, an area where the dam structure 300 is disposed, and an area therebetween.

The passivation layer 130 may be formed on the emission device layer 120 and may surround the emission device layer 120 and the circuit device layer 110. That is, the passivation layer 130 may cover a top and a side surface of the emission device layer 120 and a side surface of the circuit device layer 110. The passivation layer 130 may include an inorganic insulating material such as silicon oxide, silicon nitride, and/or the like, and particularly, may have a structure where different inorganic insulating materials are alternately stacked.

The filler 400 may be formed on, and/or surrounding, the passivation layer 130, and particularly, and may fill the space between the first substrate 100 and the second substrate 200. The filler 400 may include a transparent material for preventing penetration of water. The filler 400 may further include an adhesive material, thereby enhancing an adhesive force between the first substrate 100 and the second substrate 200. The filler 400 may extend from the active area A/A to the non-display area ND/A, and particularly, may extend to the inside of the dam structure 300.

The dam structure 300 may be disposed between the first substrate 100. The second substrate 200 and may bond the first substrate 100 to the second substrate 200, and an area between the first substrate 100 and the second substrate 200 may be sealed by the dam structure 300. The outer surfaces of the dam structures 300 may define the encapsulation area E/A, and thus, an area between the dam structures 300 may correspond to the encapsulation area E/A.

The dam structure 300 may include a sealant 310, an outer dam bank 320, and an inner dam bank 330.

The sealant 310 may bond the first substrate 100 to the second substrate 200. The sealant 310 may be formed of various materials well known to those skilled in the art, such as a thermocurable resin, a photocurable resin, and/or the like.

The outer dam bank 320 and the inner dam structure 310 may be disposed on an outer surface and an inner surface, respectively, of the sealant 310 to define a coating area where the sealant 310 is coated. The outer dam bank 320 and the inner dam structure 310 may be formed of the same material as that of a bank layer for defining a pixel area in the emission device layer 120 through the same process as the bank layer. For example, the outer dam bank 320 and the inner dam structure 310 may be formed of an organic insulating material such as polyimide, photo acryl, benzocyclobutene (BCB), and/or the like.

The alignment marks 500a and 500b may not be covered by the sealant 310 based on the position of the outer dam bank 320, which prevents the sealant 310 from spreading to the outside. Additionally, the active area A/A may not be covered by the sealant 310 based on the position of the inner dam bank 330, which prevents the sealant 310 from spreading to the inside.

As shown by the expanded portion in FIG. 2, the outer dam bank 320 and the inner dam bank 330 may have a concave-convex structure, whereby the sealant 310 is more efficiently prevented from spreading to the inside and the outside. However, the present disclosure is not limited thereto, and only one of the outer dam bank 320 and the inner dam bank 330 may have the concave-convex structure.

The outer dam bank 320 and the inner dam bank 330, as illustrated in FIG. 2, may be formed on each of the first substrate 100 and the second substrate 200, but are not limited thereto. In other embodiments, the outer dam bank 320 may be formed on only one of the first substrate 100 and the second substrate 200, and the inner dam bank 330 may be formed on only one of the first substrate 100 and the second substrate 200.

The alignment marks 500a and 500b may be disposed on the first substrate 100. The alignment marks 500a and 500b may be formed of the same material as that of an element of the circuit device layer 110 on the first substrate 100, using the same, or a similar, process. For example, the alignment marks 500a and 500b may be formed of the same material as that of the gate line of the circuit device layer 110, using the same, or a similar, process, or may be formed of the same material as that of the data line of the circuit device layer 110, using the same, or a similar, process.

The alignment marks 500a and 500b may be disposed in the non-display area ND/A. The alignment marks 500a and 500b may include a first alignment mark 500a disposed in a portion of the non-display area ND/A which does not overlap the pad area P/A, and a second alignment mark 500b disposed in another portion of the non-display area ND/A overlapping the pad area P/A. That is, the second alignment mark 500b may be disposed in the pad area P/A, and the first alignment mark 500a may be disposed in the non-display area ND/A not overlapping with the pad area P/A.

The first alignment mark 500a and the second alignment mark 500b may be disposed outside the dam structure 300. For example, the first alignment mark 500a and the second alignment mark 500b may be disposed outside the outer dam bank 320. As described above, according to an embodiment of the present disclosure, because the first alignment mark 500a and the second alignment mark 500b are disposed outside the dam structure 300, the first alignment mark 500a and the second alignment mark 500b are not covered by an encapsulating material such as the dam structure 300 or the filler 400 provided in the encapsulation area E/A, and thus, a scribing process is performed smoothly.

Figure 3:
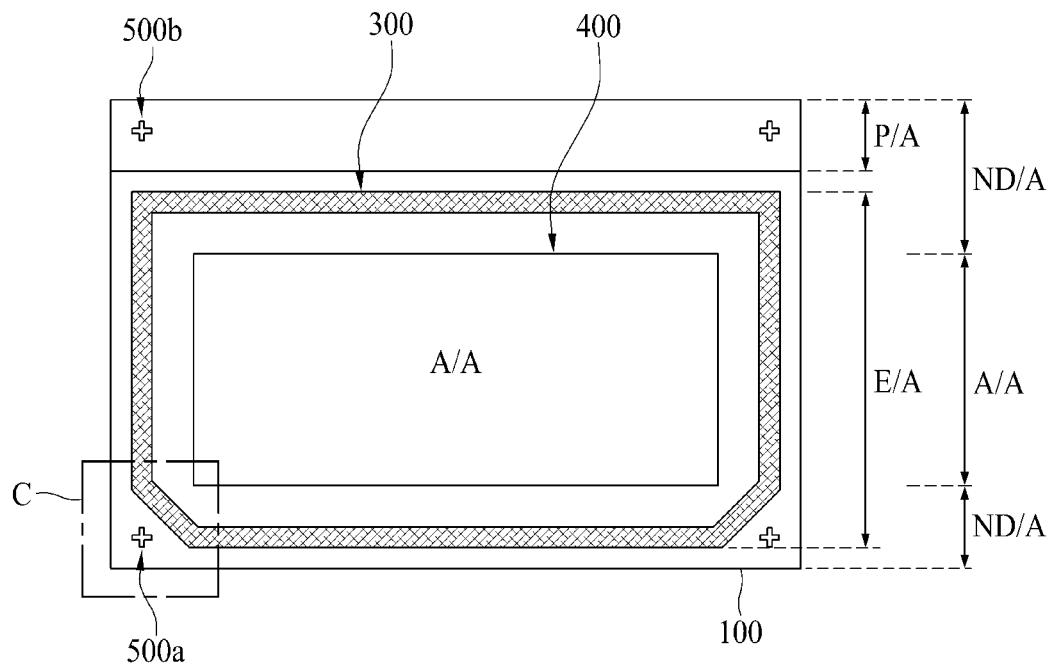
FIG. 3 is a plan view of an organic light emitting display device according to a second embodiment of the present disclosure.

FIG. 3 is a plan view of an organic light emitting display device according to a second embodiment of the present disclosure.

As shown in FIG. 3, an active area A/A may be provided on a first substrate 100, and a non-display area ND/A may be provided outside the active area A/A. The non-display area ND/A may include a pad area P/A.

A dam structure 300 may be disposed in the non-display area ND/A, and a filler 400 may be disposed on an inner side of the dam structure 300, and the dam structure 300 may be disposed to surround the active area A/A. The filler 400 may be provided to extend from the active area A/A to the inner side of the dam structure 300. In order for the pad area P/A to be exposed, the dam structure 300 may not be provided in the pad area P/A. An encapsulation area E/A, which includes the dam structure 300 and the filler 400, may be provided in the active area A/A and a partial region of the non-display area ND/A, but may not be provided in the pad area P/A.

A plurality of first alignment marks 500a and second alignment marks 500b may be formed on an outer side of the dam structure 300. The alignment marks 500a and 500b may be disposed in an edge area of the first substrate 100. As described above, the first alignment mark 500a may be disposed in a portion of the non-display area ND/A which does not overlap the pad area P/A, and the second alignment mark 500b may be disposed in another portion of the non-display area ND/A overlapping with the pad area P/A.

Since the dam structure 300 is not disposed in the pad area P/A, the second align mark 500b disposed in the pad area P/A does not overlap with the dam structure 300, and thus, is not covered by the dam structure 300. However, because the first alignment mark 500a and the dam structure 300 are disposed in the non-display area ND/A, which does not overlap with the pad area P/A, the first alignment mark 500a may overlap with the dam structure 300, and thus, may be covered by the dam structure 300.

In an embodiment of the present disclosure, the shape of the dam structure 300 may be modified to prevent overlap of the dam structure 300 and the first alignment mark 500a. Thus, the first alignment mark 500a is not covered by the dam structure 300, thereby enabling the scribing process to be performed smoothly.

For example, the dam structure 300 may be wholly formed outside the active area A/A and may have a shape corresponding to the active area A/A, but in an area (see area C of FIG. 3) where the first alignment mark 500a is disposed, the dam structure 300 may not have a shape corresponding to the active area A/A. That is, if the active area A/A has a rectangular structure, the dam structure 300 may also have a rectangular structure, but in an edge area of the first substrate 100 where the first alignment mark 500a is disposed, the dam structure 300 may not have an edge formed at a right angle.

The edge area of the first substrate 100 where the first alignment mark 500a is disposed will be described below in detail with respect to FIG. 4.

Figure 4:
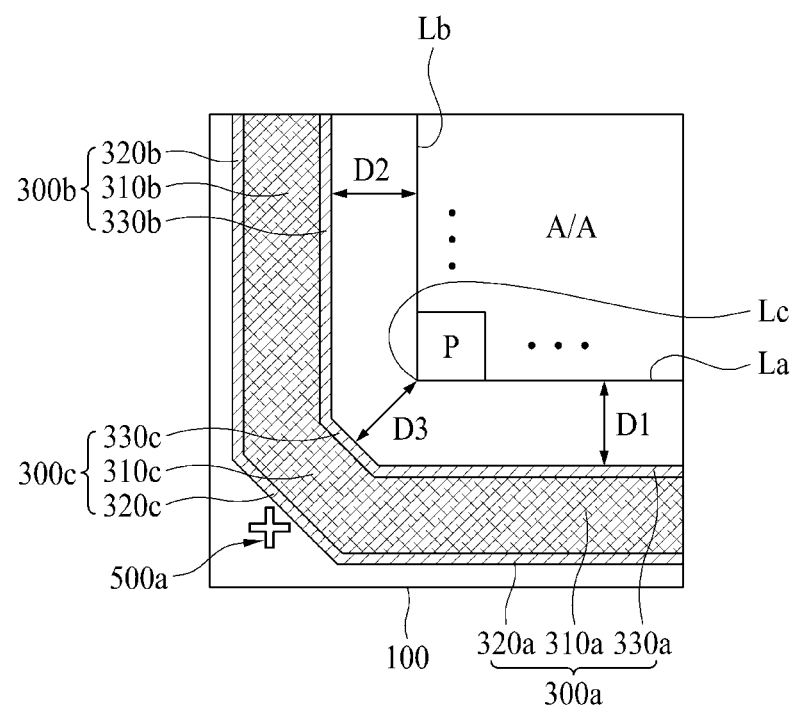
FIG. 4 is an enlarged plan view of an area C of the organic light emitting display device illustrated in FIG. 3.

FIG. 4 is an enlarged plan view of an area C of the organic light emitting display device illustrated in FIG. 3.

As shown in FIG. 4, the dam structure 300 may include a first dam structure 300a, a second dam structure 300b, and a third dam structure 300c.

The first dam structure 300a may be arranged in a first direction, for example, a horizontal direction, and may have a rectilinear structure. The first dam structure 300a may be arranged in parallel with an outermost line La of the active area A/A in the first direction. The first dam structure 300a may include a first sealant 310a, a first outer dam bank 320a, and a first inner dam bank 330a. The first sealant 310a, the first outer dam bank 320a, and the first inner dam bank 330a may all be arranged in parallel with the outermost line La of the active area A/A in the first direction. The first inner dam bank 330a may be spaced apart from the outermost line La of the active area A/A in the first direction by a first distance D1.

The second dam structure 300b may be arranged in a second direction, for example, a vertical direction, and may have a rectilinear structure. The second dam structure 300b may be arranged in parallel with an outermost line Lb of the active area A/A in the second direction. The second dam structure 300b may include a second sealant 310b, a second outer dam bank 320b, and a second inner dam bank 330b. The second sealant 310b, the second outer dam bank 320b, and the second inner dam bank 330b may all be arranged in parallel with the outermost line Lb of the active area A/A in the second direction. The second inner dam bank 330b may be spaced apart from the outermost line Lb of the active area A/A in the second direction by a second distance D2.

The third dam structure 300c may have a rectilinear structure, and may connect the first dam structure 300a to the second dam structure 300b. The third dam structure 300c may be connected to the first dam structure 300a and the second dam structure 300b at an incline. The third dam structure 300c may be arranged not to be parallel to the outermost line La of the active area A/A in the first direction and the outermost line Lb of the active area A/A in the second direction. The third dam structure 300c may be arranged apart from, and at an angle to, the vertex Lc at which the outermost line La in the first direction meets the outermost line Lb in the second direction. Therefore, due to the third dam structure 300c, a shape of the dam structure 300 differs from that of the active area A/A. The third dam structure 300c may include a third sealant 310c, a third outer dam bank 320c, and a third inner dam bank 330c. The third sealant 310c, the third outer dam bank 320c, and the third inner dam bank 330c may all be arranged not to be parallel to the outermost line La of the active area A/A in the first direction and the outermost line Lb of the active area A/A in the second direction, and each may be connected at an incline. The third inner dam bank 330c may be spaced apart from a vertex Lc, at which the outermost line La in the first direction meets the outermost line Lb in the second direction of the active area A/A, by a third distance D3.

The third sealant 310c may be connected to each of the first sealant 310a and the second sealant 310b. One end of the third sealant 310c may be connected to the first sealant 310a, and the other end of the third sealant 310c may be connected to the second sealant 310b.

The third outer dam bank 320c may be connected to each of the first outer dam bank 320a and the second outer dam bank 320b. One end of the third outer dam bank 320c may be connected to the first outer dam bank 320a, and the other end of the third outer dam bank 320c may be connected to the second outer dam bank 320b.

The third inner dam bank 330c may be connected to each of the first inner dam bank 330a and the second inner dam bank 330b. One end of the third inner dam bank 330c may be connected to the first inner dam bank 330a, and the other end of the third inner dam bank 330c may be connected to the second inner dam bank 330b.

As described above, the third dam structure 300c may be connected to each of the first and second dam structures 300a and 300b at an incline, and an area where a first alignment mark 500a is formed may be provided in an area outside the third dam structure 300c. Therefore, overlap of the first align mark 500a and the dam structure 300b is prevented without increasing the size of the non-display area ND/A. Accordingly, a bezel size of the organic light emitting display device is reduced, and moreover, the scribing process is smoothly performed.

Moreover, a first distance D1 between the first inner dam bank 330a and the active area A/A, a second distance D2 between the second inner dam bank 330b and the active area A/A, and a third distance D3 between the third inner dam bank 330c and the active area A/A may be appropriately maintained so that the active area A/A does not cover and/or overlap with the dam structure 300. For example, if the third distance D3 is reduced, the area where the first alignment mark 500a is formed is enlarged, but if the reduction in third distance D3 is too great, the active area A/A may be covered by the third sealant 310c of the third dam structure 300c. Accordingly, when the third distance D3 is adjusted to be equal to or greater than the first distance D1 or the second distance D2, the active area A/A is not covered by, and/or does not overlap with, the third sealant 310c.

Figure 5A:
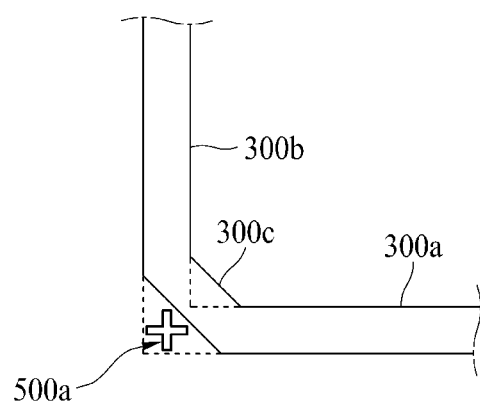
FIGS. 5A and 5B are schematic views illustrating the position of a first alignment mark according to various embodiments of the present disclosure.
Figure 5B:
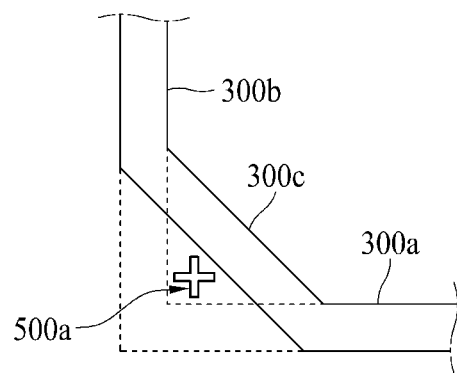

FIGS. 5A and 5B illustrate a position at which the first alignment mark according to various embodiments of the present disclosure is disposed.

As shown in FIG. 5A, a first alignment mark 500a disposed on an outer side of a third dam structure 300c may be formed on an extension line of a first dam structure 300a or an extension line of a second dam structure 300b.

Alternatively, as shown in FIG. 5B, a first alignment mark 500a disposed on an outer side of a third dam structure 300c may be formed inward from an extension line of a first dam structure 300a or an extension line of a second dam structure 300b.

As described above, because the first alignment mark 500a is formed on, or inward from, the extension line of the first dam structure 300a or the second dam structure 300b, a non-display area (ND/A) is reduced, and thus, the bezel size of an organic light emitting display device is largely reduced.

Figure 6:
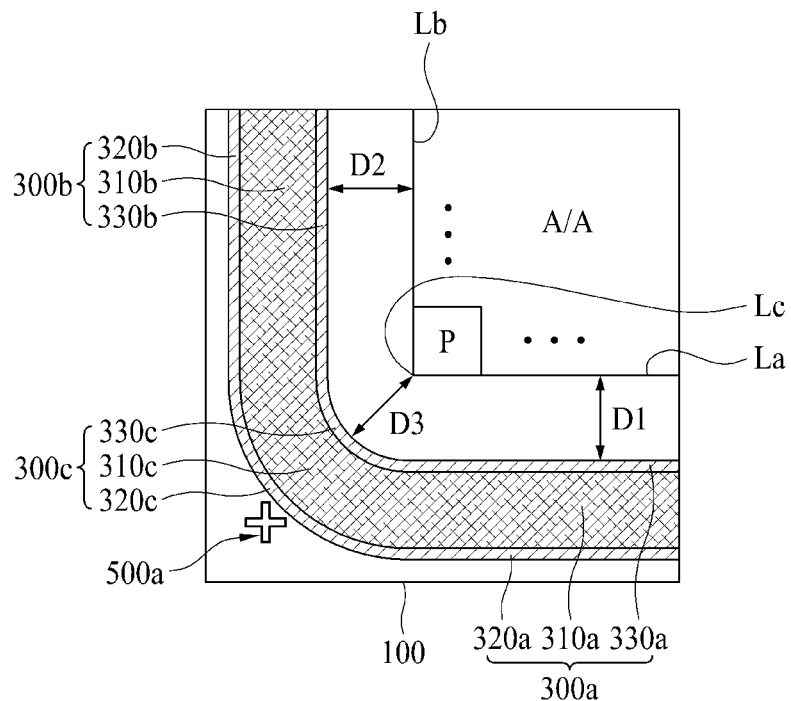
FIG. 6 is a plan view of an organic light emitting display device according to a third embodiment of the present disclosure.
Figure 7:
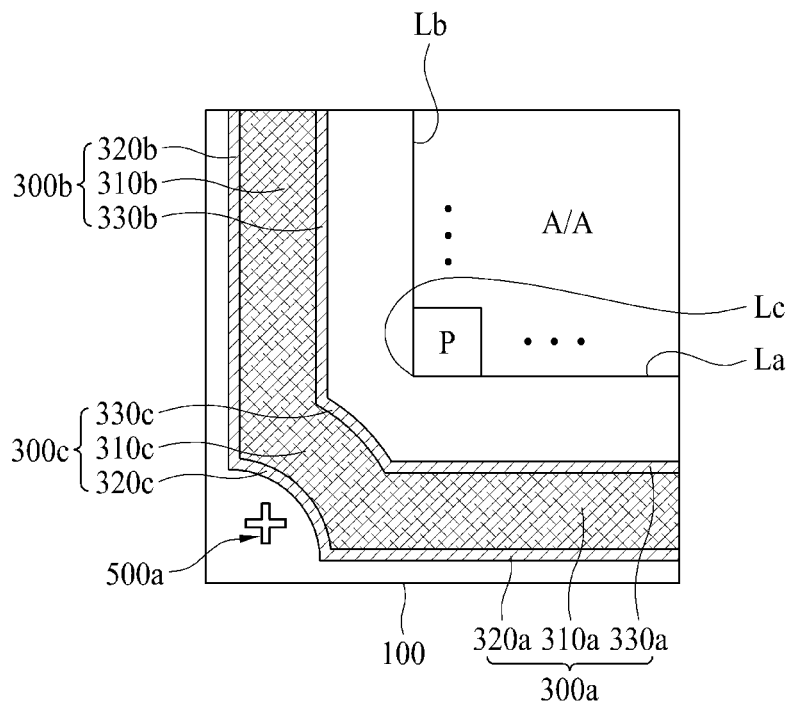
FIG. 7 is a plan view of an organic light emitting display device according to a fourth embodiment of the present disclosure.

FIGS. 6 and 7 are plan views of organic light emitting display devices according to third and fourth embodiments, respectively, of the present disclosure. In these embodiments, the organic light emitting display device illustrated in FIGS. 6 and 7 is the same as the organic light emitting display device illustrated in FIG. 4, except that the structure of the third dam structure 300c is modified. Hereinafter, only different elements will be described for brevity.

According to the embodiment illustrated in FIG. 4, the third dam structure 300c may have a rectilinear structure. However, in the embodiments illustrated in FIGS. 6 and 7, the third dam structure 300c may have a curved structure.

For example, in FIG. 6, a center point of a curve structure of a third dam structure 300c may be disposed inward from the third dam structure 300c, and thus, the curve structure of the third dam structure 300c may be a structure which is convex on an outer side and concave on an inner side. In this case, a distance D3 between the third dam structure 300c and an outermost line Lc of an active area A/A is sufficiently secured.

Moreover, in FIG. 7, a center point of a curve structure of a third dam structure 300c may be disposed outward from the third dam structure 300c, and thus, the curve structure of the third dam structure 300c may be a structure which is convex on an inner side and concave on an outer side. In this case, an area where a first alignment mark 500a is disposed is formed outside the third dam structure 300c, and is sufficiently secured.

Figure 8:
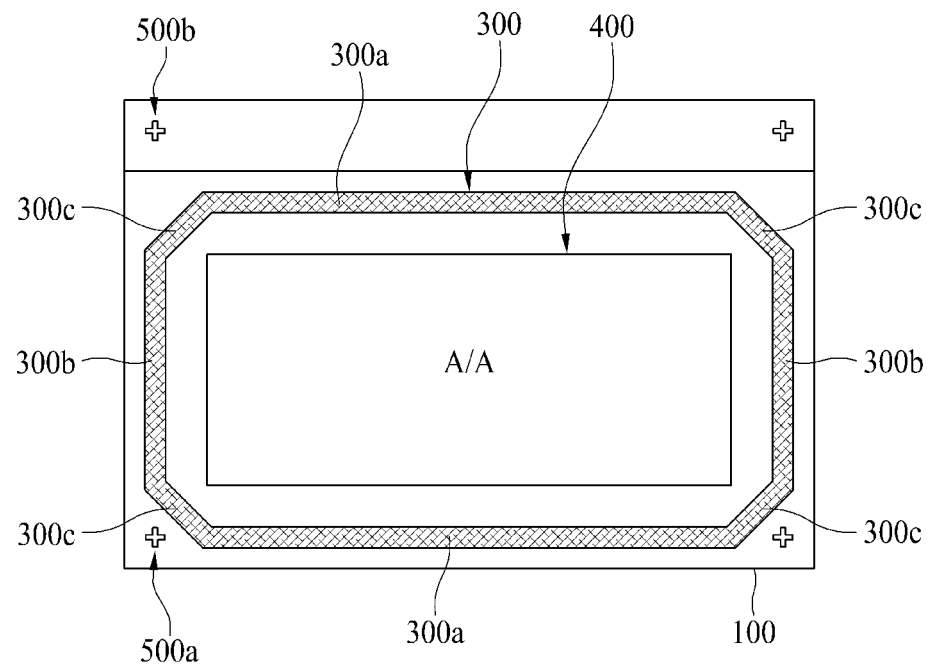
FIG. 8 is a plan view of an organic light emitting display device according to a fifth embodiment of the present disclosure.

FIG. 8 is a plan view of an organic light emitting display device according to a fifth embodiment of the present disclosure. The organic light emitting display device illustrated in FIG. 8 is the same as the organic light emitting display device illustrated in FIG. 3, except that the structure of the dame structure 300 is modified. Hereinafter, only different elements will be described for brevity.

As shown in FIG. 8, a dam structure 300 may include two first dam structures 300a that are arranged in a first direction to have a rectilinear structure, two second dam structures 300b that are arranged in a second direction to have a rectilinear structure, and four third dam structures 300c that have a rectilinear structure are inclined with respect to the first dam structures 300a and the second dam structures 300b, and connect the first dam structures 300a to the second dam structures 300b.

In the above-described structure illustrated in FIG. 3, the third dam structure 300c may be disposed near the first alignment mark 500a, but the third dam structure 300c may not be disposed near, or overlap with, the second alignment mark 500b. Therefore, in a portion near the second alignment mark 500b, the first dam structure 300a and the second dam structure 300b may be directly connected to each other and may have a shape corresponding to an outermost line of an active area A/A.

On the other hand, according to the embodiment illustrated in FIG. 8, a third dam structure 300c may be disposed near the first alignment mark 500a and another third dam structure 300c may be disposed near the second alignment mark 500b, thereby reducing the possibility that the second alignment mark 500b disposed in a pad area P/A is covered by, or overlaps with, the dam structure 300.

Figure 9:
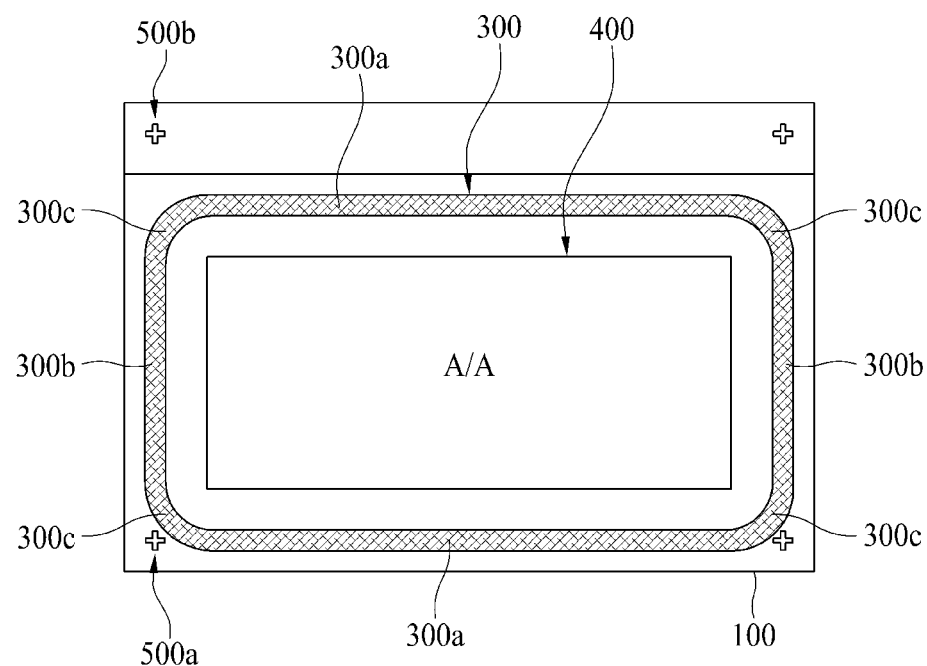
FIG. 9 is a plan view of an organic light emitting display device according to a sixth embodiment of the present disclosure.
Figure 10:
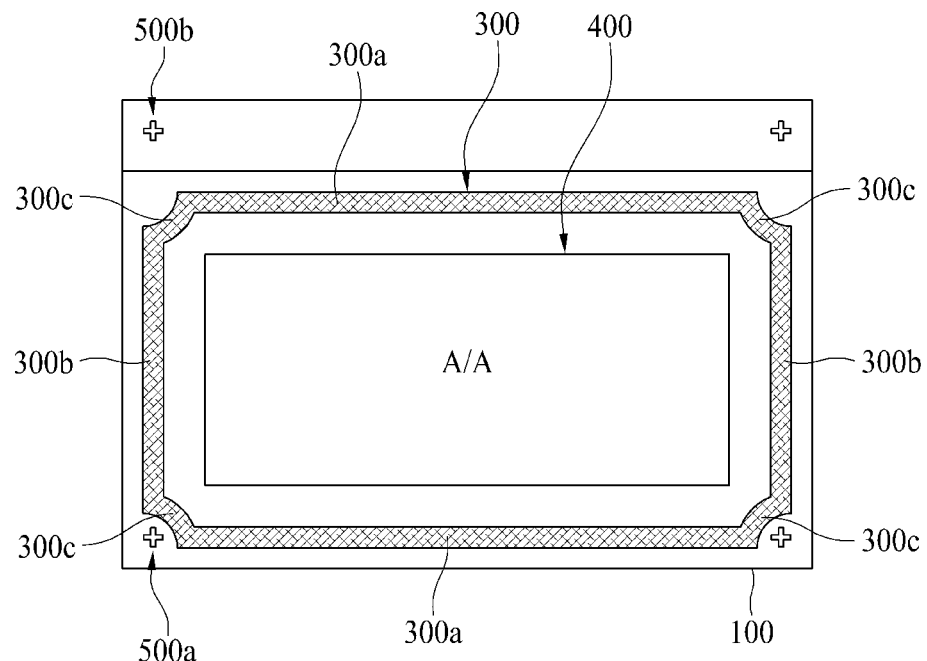
FIG. 10 is a schematic plan view of an organic light emitting display device according to a seventh embodiment of the present disclosure.

FIGS. 9 and 10 are plan views of organic light emitting display devices according to sixth and seventh embodiments of the present disclosure. The organic light emitting display device illustrated in FIGS. 9 and 10 are the same as the organic light emitting display device illustrated in FIG. 8, except that the third dam structure 300c is modified such that the third dam structure 300c in FIGS. 9 and 10 have a curved structure.

The organic light emitting display device illustrated in FIG. 9 may be implemented by applying the third dam structure 300c of FIG. 6 to four edge areas. Similarly, the organic light emitting display device of FIG. 10 may be implemented by applying the third dam structure 300c of FIG. 7 to four edge areas.

Figure 11:
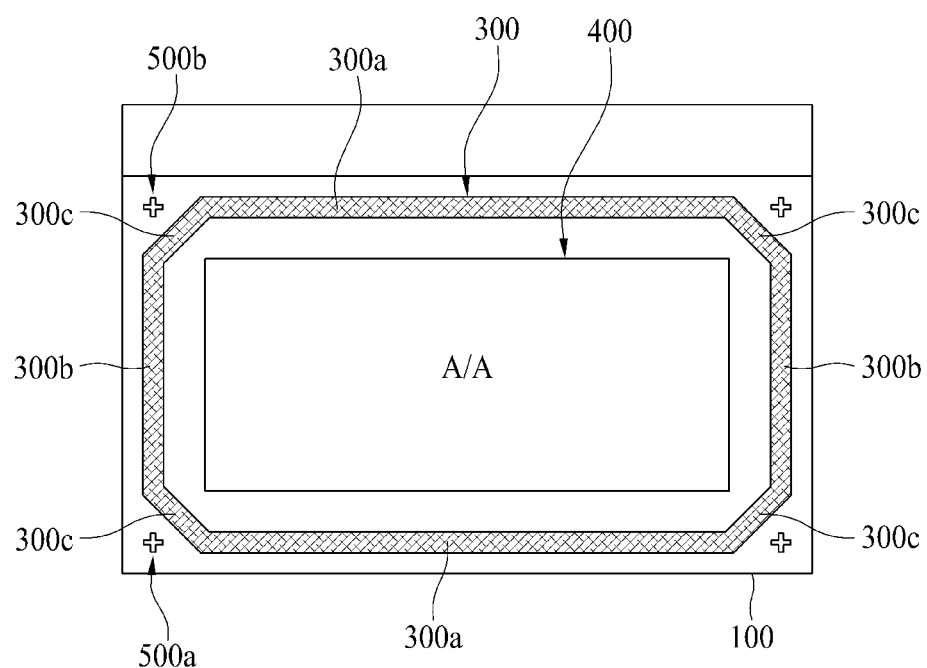
FIG. 11 is a schematic plan view of an organic light emitting display device according to a eighth embodiment of the present disclosure.
Figure 12:
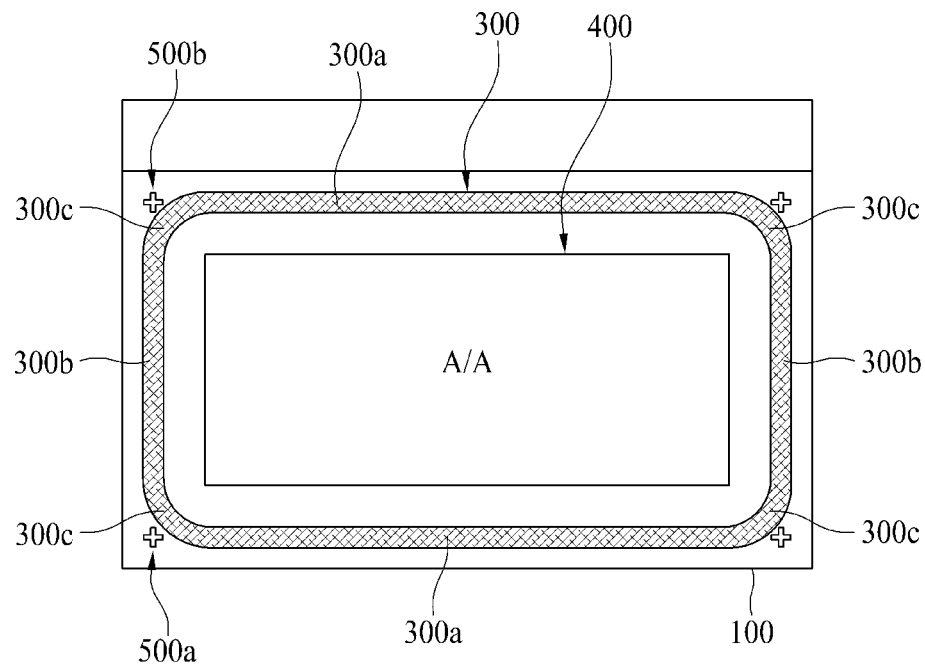
FIG. 12 is a schematic plan view of an organic light emitting display device according to a ninth embodiment of the present disclosure.
Figure 13:
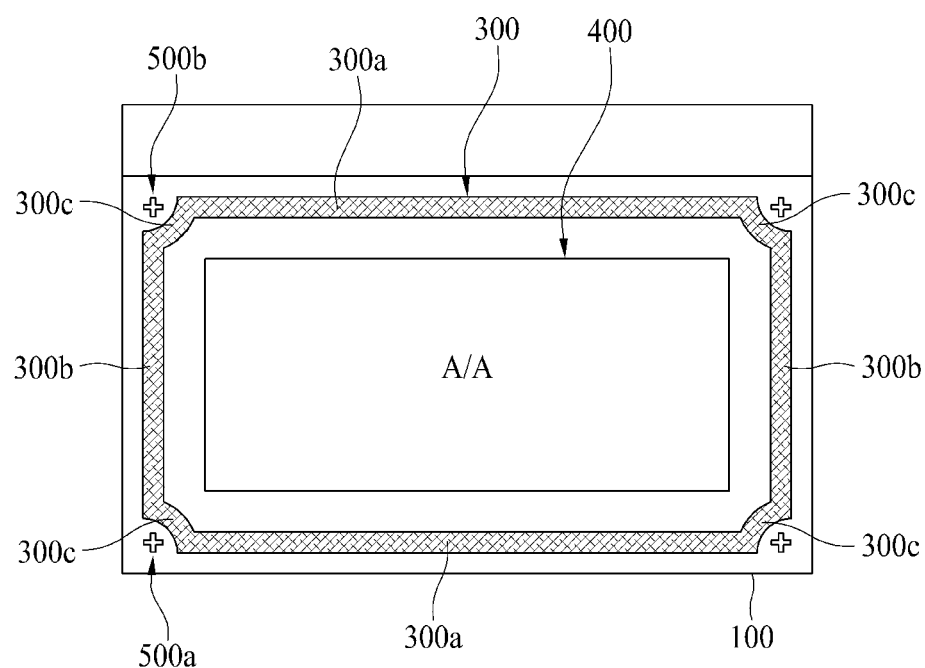
FIG. 13 is a schematic plan view of an organic light emitting display device according to a tenth embodiment of the present disclosure.

FIGS. 11-13 are schematic plan views of an organic light emitting display device according to additional embodiments of the present disclosure. The organic light emitting display devices illustrated in FIGS. 11-13 are similar to the organic light emitting display device illustrated in FIGS. 8-10, respectively, except that both the first and second alignment marks 500a and 500b, respectively, are disposed near the third dam structure 300c, and neither the first and second alignment marks are disposed in the pad area.

The organic light emitting display device according to the embodiments of the present invention may be applied as various types well known to those skilled in the art, such as a top emission type, a bottom emission type, etc.

As described above, according to various embodiments of the present disclosure, the alignment mark may not be covered by, and may not overlap with, the dam structure, because the alignment mark is disposed outside the dame structure. Thus, the scribing process is performed smoothly.

Particularly, according to various embodiments of the present disclosure, the third dam structure may be connected to each of the first and second dam structures at an incline, and the first alignment mark may be disposed outside the third dam structure, thereby preventing the first alignment mark from being covered by, or overlapping with, the dam structure without increasing the size of the non-display area. Accordingly, the bezel size of the organic light emitting display device is reduced, and the scribing process may be performed smoothly.

It will be apparent to those skilled in the art that various modifications and variations can be made to the present disclosure without departing from the spirit or scope of the intended inventions. The present disclosure covers the modifications and variations of the invention described therein, provided they fall within the scope of any appended claims and their equivalents.

What is claimed is:

1. An organic light emitting display device comprising:
a substrate including an active area and a non-display area provided outside the active area;
a dam structure in the non-display area of the substrate; and
an alignment mark in the non-display area of the substrate,
wherein the dam structure has a first dam structure arranged in a first direction, a second dam structure arranged in a second direction and a third dam structure between the first dam structure and the second dam structure,
wherein the third dam structure is connected to each of the first dam structure and the second dam structure in an inclined shape,
wherein the first dam structure has a first outer dam bank and a first inner dam bank arranged to be apart from each other,
the second dam structure has a second outer dam bank and a second inner dam bank arranged to be apart from each other,
the third dam structure has a third outer dam bank and a third inner dam bank arranged to be apart from each other.

2. The organic light emitting display device of claim 1, wherein one end of the third outer dam bank is connected to the first outer dam bank, and the other end of the third outer dam bank is connected to the second outer dam bank, and
wherein one end of the third inner dam bank is connected to the first inner dam bank, and the other end of the third inner dam bank is connected to the second inner dam bank.

3. The organic light emitting display device of claim 1, wherein the first dam structure further comprises a first sealant between the first outer dam bank and the first inner dam bank,
the second dam structure further comprises a second sealant between the second outer dam bank and the second inner dam bank,
the third dam structure further comprises a third sealant between the third outer dam bank and the third inner dam bank.

4. The organic light emitting display device of claim 1, wherein the alignment mark is located adjacent to a corner of the substrate.

5. The organic light emitting display device of claim 1, wherein the first dam structure and the second dam structure having a shape that corresponds to an outermost line of the active area.

6. The organic light emitting display device of claim 1, wherein outlines of the first dam structure and the second dam structure are respectively in a direction parallel to an outline of the active area.

7. The organic light emitting display device of claim 1, wherein the third dam structure has a convex portion with respect to a corner of the active area.

8. The organic light emitting display device of claim 1, wherein the third dam structure has a concave portion with respect to a corner of the active area.

9. The organic light emitting display device of claim 1, wherein a distance between the third dam structure and an outermost line of the active area is equal to or greater than a distance between the first dam structure and the outermost line of the active area in the first direction or the distance between the second dam structure and the outermost line of the active area in the second direction.

10. The organic light emitting display device of claim 1, wherein the substrate comprises a pad area in the non-display area, and
the alignment mark is provided in the pad area.

11. The organic light emitting display device of claim 1, wherein the alignment mark is provided between an outermost line of the substrate and the dam structure.

12. The organic light emitting display device of claim 1, further comprising an emission device layer in the active area of the substrate and a passivation layer covering a top of the emission device layer.

13. The organic light emitting display device of claim 1, further comprising an emission device layer in the active area of the substrate, and an encapsulation layer encapsulating the emission device layer and extending to the dam structure.

* * * * *